(12) United States Patent
Buse et al.

(10) Patent No.: US 8,437,066 B2
(45) Date of Patent: May 7, 2013

(54) OPTICAL PURIFICATION OF CRYSTALS

(75) Inventors: Karsten Buse, Bonn (DE); Matthias Falk, Los Altos Hills, CA (US); Daniel Haertle, Bonn (DE); Michael Koesters, Bonn (DE)

(73) Assignee: Deutsche Telekom AG, Bonn (DE)

( * ) Notice: Subject to any disclaimer, the term of this patent is extended or adjusted under 35 U.S.C. 154(b) by 650 days.

(21) Appl. No.: 12/524,475

(22) PCT Filed: Jan. 18, 2008

(86) PCT No.: PCT/DE2008/000079
§ 371 (c)(1),
(2), (4) Date: Apr. 15, 2010

(87) PCT Pub. No.: WO2008/092421
PCT Pub. Date: Aug. 7, 2008

(65) Prior Publication Data
US 2010/0195185 A1 Aug. 5, 2010

(30) Foreign Application Priority Data
Jan. 30, 2007 (DE) .................. 10 2007 004 400

(51) Int. Cl.
*G02F 1/03* (2006.01)
(52) U.S. Cl.
USPC .......................................................... 359/257
(58) Field of Classification Search ................... 359/257
See application file for complete search history.

(56) References Cited

U.S. PATENT DOCUMENTS

| | | | |
|---|---|---|---|
| 2005/0204999 A1 | 9/2005 | Parthier et al. | |
| 2006/0291519 A1 | 12/2006 | Buse et al. | |
| 2007/0155004 A1* | 7/2007 | Buse et al. | 435/262.5 |

FOREIGN PATENT DOCUMENTS

| | | |
|---|---|---|
| DE | 10300080 A1 | 7/2004 |
| DE | 102004002109 A1 | 8/2005 |
| EP | 1566471 A2 | 8/2005 |
| WO | 2005068690 A1 | 7/2005 |

OTHER PUBLICATIONS

K. Buse et al.: "Origin of thermal fixing in photorefractive lithium niobate crystals," Physical Review B., vol. 56, No. 3, Jul. 15, 1997, pp. 1225-1235, XP002510662.

Akazawa et al.: "Electro-optic properties of c-axis oriented LiNbO3 films grown on Si(1 0 0) substrate," Materials Science and Engeneering B: Solid-State Materials for Advanced Technology, vol. 120, No. 1-3, 2005, pp. 50-54, XP002510663.

(Continued)

*Primary Examiner* — James Jones
(74) *Attorney, Agent, or Firm* — Leydig, Voit & Mayer, Ltd.

(57) ABSTRACT

Method for preparing a purified crystal for use in an optical component, from an impure crystal having impurities or crystal defects capable of causing a specific absorption of incident light, includes heating the impure crystal to a temperature at which ions in the crystal are mobile and provide conductivity. A part of the crystal is illuminated with an electromagnetic purifying beam having a frequency in or near a visible frequency range so as to optically excite and migrate charges in the crystal, the charges being compensated by a countermigration of the ions so as to be fixed in place thereafter so as to provide a purified crystal zone. The crystal is cooled to a future operating temperature.

25 Claims, 2 Drawing Sheets

OTHER PUBLICATIONS

T. Volk et al.: "Thermal Fixation of the Photorefractive Holograms Recorded in Lithium Niobate and Related Crystals," Critical Reviews in Solid State and Materials Sciences, No. 30, 2005, pp. 125-151, XP002510664.

M. Mueller et al.: "Influence of ultraviolet illumination on the poling characteristics of lithium niobate crystals," Applied Physics Letters, vol. 83, No. 9, Sep. 1, 2003, pp. 1824-1826, XP002510665.

M. Falk et al.: "Thermo-electric method for nearly complete oxidization of highly iron-doped lithium niobate crystals," Applied Physics B: Lasers and Optics, No. 81, 2005, pp. 853-855, XP002510666.

K. Buse et al.: "Development of thermally fixed holograms in photorefractive lithium-niobate crystals without light," Optical Materials, No. 18, 2001, pp. 17-18, XP002510667.

L. Chan et al.: "High Bandwidth Memory System Using Wavelength Multiplexed Volume Holograms," Institute for Information Technology, National Research Council, Ottawa, Ontario, KIA OR6, Mar. 1993.

H. Vormann et al.: "Hydrogen as Origin of Thermal Fixing in $LiNbO_3$:Fe," Solid State Communications, vol. 40, pp. 543-545.

* cited by examiner

OPTICAL PURIFICATION OF CRYSTALS

CROSS REFERENCE TO PRIOR APPLICATIONS

This application is a U.S. National Phase application under 35 U.S.C. §371 of International Application No. PCT/DE2008/000079, filed on Jan. 18, 2008 and which claims benefit to German Patent Application No. 10 2007 004 400.5, filed on Jan. 30, 2007. The International Application was published in German on Aug. 7, 2008 as WO 2008/092421 A1 under PCT Article 21(2).

FIELD

The present invention relates to a method for purifying and thereby preparing crystals, for example, lithium niobate or lithium tantalate crystals, for use in optical components, for example, in nonlinear optical and electro-optical components, wherein impurities, for example, $Fe^{2+}$ ions, or crystal defects are present in the crystals and cause a specific absorption of incident light.

BACKGROUND

Crystals such as lithium niobate or lithium tantalate are used in components for laser optics, for example, in frequency doublers or frequency mixers. However, in general there exists the problem that under intense irradiation with laser light, the light beam passing through the crystal is distorted and thus loses its quality. The efficiency of the frequency conversion drops. The reason for the loss of beam quality lies in the fact that the laser light excites charge carriers that are then redistributed and captured at other locations. This causes the buildup of space-charge fields that produce local modulations of the index of refraction, at which the light beam fans out. In addition, the charge carrier transfer can cause a change in absorption if the capturers of the charges have a different photon absorption cross-section. As a result of the Kramers-Kronig relationships for the complex index of refraction, the index of refraction is also affected by these absorption changes. The inhomogeneous changes in the index of refraction and the light-induced absorption changes are referred to as "optical damage."

Hereinafter, when reference is made to electrons, it is intended to apply quite generally to electronic charges. This can include both electron and hole transport.

The charge redistribution is largely caused by contaminants with ions that can take on multiple valence states within the crystal and are thus both electron donors and electron traps. For example, iron, which occurs in lithium niobate and lithium tantalate in the valence states $Fe^{2+}$ and $Fe^{3+}$, is such a contaminant. Here, the charges are excited from $Fe^{2+}$ lattice defects and are transported through the conduction band to places where $Fe^{3+}$ ions trap these electrons. Intrinsic crystal defects occurring in multiple valence states can promote this process or can make it possible on their own. In lithium niobate, for example, there is what is known as the "antisite defect," where $Nb^{5+/4+}$ sits at a Li site. In addition, the charges can be trapped in centers where they lead to an increase in absorption. All of these effects are also considered optical damage.

The cause of optical damage is thus, most generally, that defects where electrons can be excited by light are present in the crystals. On the other hand, this means that the higher the purity of the crystal, and the fewer opportunities for charge excitation it offers, the smaller the optical damage will be.

Now, the avoidance of undesired contaminants as early as the growing of the crystals, to the extent that this can be done, is known. However, it has proven to be very difficult to grow crystals with a doping of less than 10 ppm of unwanted ions. It is also known to purify the crystal of excitable electrons after the fact by thermal or thermoelectric oxidation, in that the electron-donating ions are oxidized, which is to say that the $Fe^{2+}$ ions are converted to the $Fe^{3+}$ state. In terms of charge, the excess electrons that are liberated are compensated by the inclusion or exclusion of ions. These methods are known as annealing, wherein their purifying effect is made possible by heating of the crystal to high temperatures. External electrical voltages applied to the crystal can assist the process. Here, the concentration ratio of filled to empty lattice defects serves as a measure of the oxidation. At low concentration ratios, only correspondingly little charge can be transported, since the electron donors are lacking. Accordingly, no space charge field is developed. Moreover, fewer electrons can be transported to centers that lead to stronger absorption. Optical damage is thus reduced. However, the optical damage may possibly appear again above a certain "threshold intensity," because new possibilities for excitation are created, for example, by multiple-photon excitation, and other centers take part in charge transport.

To reduce optical damage, the crystals can also be doped with magnesium, for example; however, this doping degrades other properties. Thus, for example, it becomes significantly more difficult to produce "periodically polarized" crystals in which the spontaneous polarization is periodically inverted. However, this periodic polarization is a prerequisite for numerous nonlinear optical applications such as frequency conversion with the aid of "quasi-phase matching."

Even though the prior art methods have a significant purifying effect, the purity of the treated crystals is frequently inadequate for applications with high-intensity laser beams. For this reason, it has also scarcely been possible to date to employ nonlinear optical or electro-optical components such as, for example, frequency doublers, frequency mixers, optical parametric oscillators (OPOs), or electro-optic modulators in conjunction with high-intensity laser beams. The optical damage to which these laser beams expose the components has to date impaired their functionality to an unacceptable degree, or else has made the production of the components significantly more difficult or costly as a result of the aforementioned co-doping with magnesium or other elements.

SUMMARY

An aspect of the present invention is to create a method that is simple and inexpensive to implement and with which the crystals, for example, lithium niobate and lithium tantalate, can be purified to a degree not heretofore achieved, so that the absorption of even intense radiation in the crystal is reduced to a minimum.

In an embodiment, the present invention provides for a method for preparing a purified crystal for use in an optical component, from an impure crystal having impurities or crystal defects capable of causing a specific absorption of incident light. The method includes heating the impure crystal to a temperature at which ions in the crystal are mobile and provide conductivity. A part of the crystal is illuminated with an electromagnetic purifying beam having a frequency in or near a visible frequency range so as to optically excite and migrate charges in the crystal, the charges being compensated by a counter-migration of the ions so as to be fixed in place thereafter so as to provide a purified crystal zone. The crystal is cooled to a future operating temperature.

BRIEF DESCRIPTION OF THE DRAWINGS

The present invention is described in greater detail below on the basis of embodiments and of the drawings in which.

Figure 1:
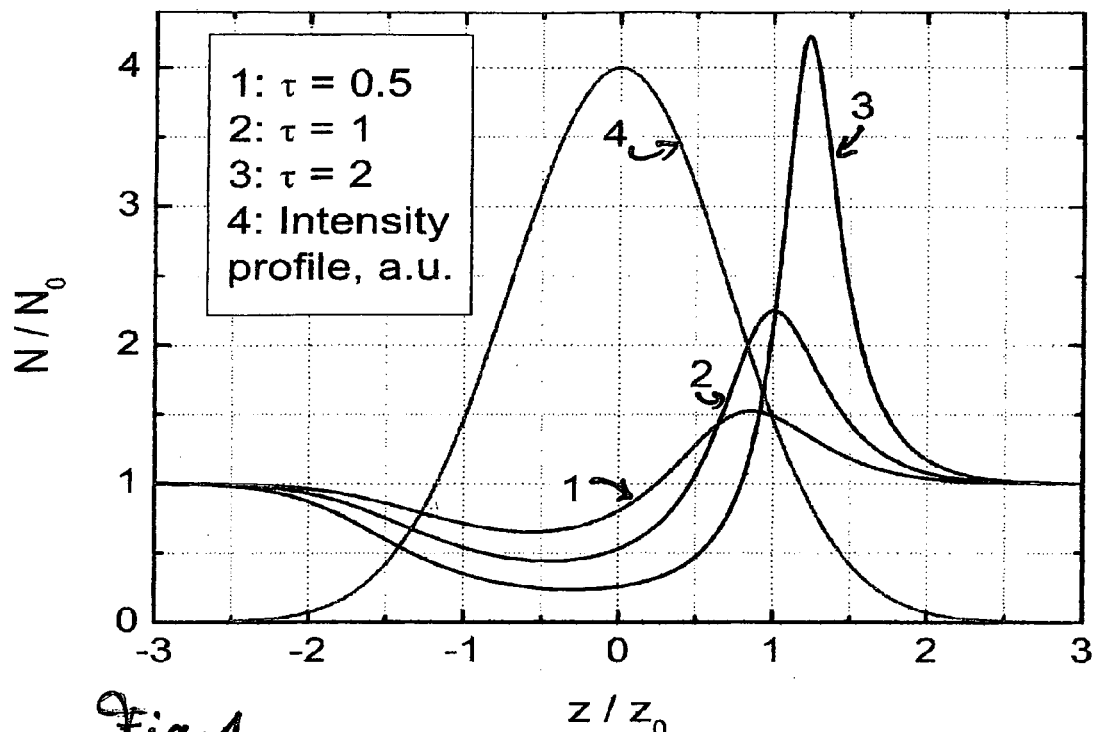
FIG. 1 shows an intensity profile and three concentration profiles.

The basic idea of the present invention is to "desensitize" a crystal to a certain degree with a light beam acting as a purifying beam within a useful area for the later passage of light beams. Method steps are used here to ensure that the purified useful area is preserved as such for later use, and the purifying process cannot simply reverse itself. Within the scope of this purification method in accordance with the present invention, the crystal can be first heated to a temperature that can be set such that ions become mobile in sufficient quantities and appropriate ionic conductivity can be observed. In this regard, in lithium niobate and lithium tantalate crystals, for example, the $H^+$ ions that are always present are responsible for ionic conductivity along with the $Li^+$ ions. To emphasize this point: The redistribution of whole ions is meant here, and not—as described above as the cause of optical damage—the redistribution of charge carriers (electrons in the conduction band or holes in the valence band), which originate from ions and crystal defect locations.

In this state of high ionic mobility, the crystal can be illuminated with a light beam having a frequency in or near the visible region. This purifying beam has the effect that, initially, charge carriers from ions or crystal defect locations are excited and redistributed. On account of the high temperature, another process takes place at the same time: The ions drift in the electric field that is produced and compensate for the redistributed charges. The space-charge field is kept small in this way. The light redistributes additional charge carriers from the ions and crystal defect locations, which then are likewise compensated by drifting ions. A purification of the crystal takes place in this way. With this purification, a stationary state would not be reached until no more charges excitable by light are present in the illuminated area, insofar as sufficient ions are available to compensate all electrons or holes redistributed by light.

It is advantageous, for example, for this purification to use a beam with an intensity profile, so that brighter and darker regions are present in the crystal. In this regard, the cross-section of the purifying beam is generally of "macroscopic" dimensions lying in the micrometer to millimeter range. Since the light can only drive the charge redistribution in the brighter regions, the electrons collect in the darker regions and are compensated there by ions. The electronic charge transport can include either migrating electrons or migrating holes or both. Thus, with an inhomogeneous purifying beam, charges are "swept" as if with a broom from the illuminated regions to the dark zone after optical excitation, where electronic charges and those of the ions compensate one another.

As a result of the motion and the compensation, a zone that is purified, and thus usable for later purposes, is created in the crystal. This zone is kept "clean" by the cooling of the crystal, for example, to the future operating temperature, such as room temperature, in that the state is frozen to a certain extent, i.e., ions, such as, e.g., $H^+$ and $Li^+$, are nearly immobile at room temperature in lithium niobate and lithium tantalate crystals. The redistributed charges adhering thereto are thus also fixed in place, and the purification process is stable. In this way, crystals can be made robust within the scope of the useful zone with respect to further illumination, so that they can be used even at high optical power levels, in particular for nonlinear optical and electro-optical components. In an embodiment, the useful zones can be extracted from the purified crystal, which can take place, for example, by the means that the crystal is separated from the unpurified regions, for example, by mechanical cutoff.

The mobile ions required for the charge transport, for example, $H^+$ ions or $Li^+$ ions in lithium niobate or lithium tantalate, are present in the crystal. Their mobility increases exponentially with increasing temperature according to the Arrhenius law. The temperature range between approximately 150 and 220° C. has proven to be suitable as the temperature range for the method presented; the ionic conductivity $\sigma_{ion}$ there has a value at which the "ionic Maxwell time" $\tau_{ion} = \epsilon \epsilon_0 / \sigma_{ion}$ is in the range of seconds to minutes. Here, $\epsilon$ represents the dielectric constant of the material, and $\epsilon_0$ is the dielectric constant of vacuum. Within this "ionic Maxwell time," space-charge fields in the crystal decay by the factor 1/e as a result of the ionic conductivity. In order to have a sufficient quantity of suitable ions available for compensation, it can be advantageous to intentionally fill the crystal with ions in advance of the inventive purification by means of heat treatment at relatively high temperatures, in particular in a moist atmosphere.

The electrons can also be thermally excited from crystal defect locations, with the Arrhenius law applying accordingly. However, in the case of electrons, the activation energy and thus the temperature dependence are greater. The electrons therefore only dominate thermal conductivity at relatively high temperatures, while ionic conductivity dominates up to approximately 200° C. However, electronic conductivity can be set over a broad range by light-induced excitation and redistribution, as described above. A favorable factor here is a light intensity of the purifying light that results in the "electronic Maxwell time" $\tau_{electron} = \epsilon \epsilon_0 / \sigma_{electron}$ being approximately equal to the ionic Maxwell time $\tau_{ion}$, where $\sigma_{electron}$ designates the electronic conductivity produced by the purifying light.

In lithium niobate or lithium tantalate crystals, the "volume photovoltaic effect" is dominant in the redistribution of the excited charge carriers, however, this is based on the fact that these crystals are acentric and thus have a preferred direction. It can be advantageous to direct the purifying beam along the direction of the volume photovoltaic effect, thus in a sense "sweeping with the wind."

To promote the transport of electrons, it can also be useful to apply an additional external electric field as a charge carrier drive, causing the electrons to drift by means of the Coulomb force. If the wavelength the crystal will later be used with is known ahead of time, it can be advantageous for the purifying laser beam to have a wavelength that is at least close to that of the light to be used later or to that of the light later generated by the crystal through a nonlinear optical effect. This measure ensures an especially effective purification with regard to this wavelength.

In the method presented here, it can be advantageous to spatially pass the light beam through the crystal multiple times in order to remove additional electrons each time. This can be advantageous to the extent that the change in charge carrier density is locally determined by the continuity equation: div $j + d\rho/dt = 0$, where j is the vector of the current density, $\rho$ is the density of redistributable electrons, and t is time.

In order to remove electrons, hence for $d\rho/dt \neq 0$, it is necessary that the current density j be location-dependent, hence div j must not vanish. However, the divergence of the current density is large at the edges of, for example, a Gaussian pattern. It can therefore be advantageous to displace the beam, and thus the position of the edges, in order to thereby remove a certain quantity of electrons from the lattice defects over large regions. It can be advantageous for this process to be repeated several times.

In this way, the illuminated region can become resistant to "optical damage," since with the optical purification described above, charges that can be excited with light of the selected wavelength can be specifically transported away and can be captured at the edges by the ions. Therefore, space-charge fields and hence also disruptive refractive index and absorption changes should no longer build up. The strength of the resistance to "optical damage" depends on factors including the light dose employed in the optical purification. It can therefore be advantageous to cause the beam to pass through the crystal repeatedly by means of mirrors, or to place the crystal in a resonator.

The purifying effect remains even when the crystals are cooled off; the heating is only needed for the duration of the purification process.

The inventive method is similar to "thermal fixing" in lithium niobate or lithium tantalate crystals, wherein electrons are also redistributed with light and the electronic charge patterns are compensated with ionic charge patterns. In contrast to the present invention, however, crystals doped with transition metal ions to increase the photorefractive effect are used in thermal fixing. In contrast, according to the present invention, crystals are used in which the introduction of ions from which light can excite charge carriers is intentionally avoided. Thermal fixing is used for storing holograms, wherein the illumination takes place with interference patterns, and not with individual stripes of light or even homogeneous illumination. A major difference is that the sizes of the bright regions in "thermal fixing" are on the order of magnitude of light wavelengths (500 nm). In contrast, a light beam of "macroscopic" dimensions, whose width can reach sizes on the order of a few millimeters, is used in the present invention. In addition, the light pattern is kept spatially constant in thermal fixing, since the purpose is to store the light pattern in the form of space charges. In contrast, in the purification method presented here, it can be advantageous to move the light pattern through the crystal as explained above.

A lithium niobate or lithium tantalate crystal in which the normal of the incident beam face is parallel to the x-axis of the crystal is exposed at elevated temperature to a strip of light with a Gaussian intensity distribution along the z-axis of the crystal. The profiles are thus plotted in the z-direction below.

Under optimal conditions, the temperature-dependent progression of a profile of a normalized number of compensated charges $N(z/z_0)/N_0$ is controlled only by the length of the normalized illumination time $\tau = t/t_0$, where $t_0$, as the characteristic time, is given by $t_0 = z_0 \hbar \omega/(I_{pv} \sigma I_0)$, where $I_{pv}$ is the volume photovoltaic length parameter of the mean travel of the electron per absorbed photon, $\sigma$ is the absorption cross-section, $\hbar \omega$ is the energy of a quantum of light, and $I_0$ is the light intensity. The parameter $I_{pv}$ corresponds to a representation of the volume photovoltaic current density $j_{pv} = e\alpha I_0 I_{pv}/(\hbar \omega)$, where e is the electron charge and $\alpha = N \sigma$ is the light absorption coefficient. The parameters $I_{pv}$ and $\sigma$ are known from experiment. Typically, $I_{pv} = (0.5-1) \times 10^{-8}$ cm and $\sigma$ is approximately $5 \times 10^{-16}$ cm$^2$ at $\lambda = 500$ nm. For a peak intensity $I_0 = 1$ W/cm$^2$ and a Gaussian width $z_0 = 1$ mm, $t_0$ is estimated at approximately 5 h.

In FIG. 1, the lines 1, 2 and 3 show the normalized profiles $N(z/z_0)/N_0$ for three different values of the normalized time $\tau = 0.5, 1,$ and $2$. It can be seen that the concentration distribution is not symmetrical with respect to the center of the light beam, the profile of which is labeled 4. The tendency of the curve $N(z/z_0)/N_0$ with increasing time $t/t_0$ is clearly visible. The illumination distributes electrons through the central region to the right-hand edge of the illuminated region, and creates a pronounced concentration maximum there. The longer the time t is, the sharper this maximum becomes.

Figure 2:
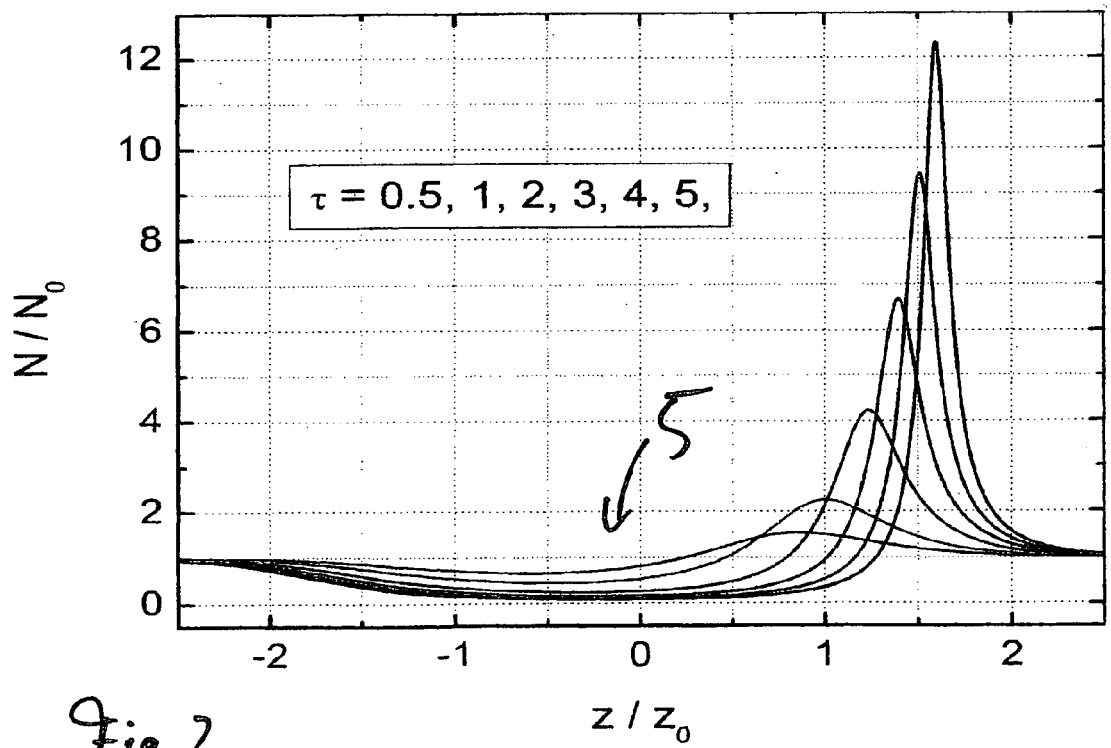
FIG. 2 shows concentration profiles as a function of treatment duration.

FIG. 2 shows the light-induced profiles for progressively increasing normalized exposure times $\tau$. It can be seen that the maximum becomes sharper and moves further to the right-hand side with increasing $\tau$. In contrast, the concentration in the center of the crystal decreases steadily.

Figure 3:
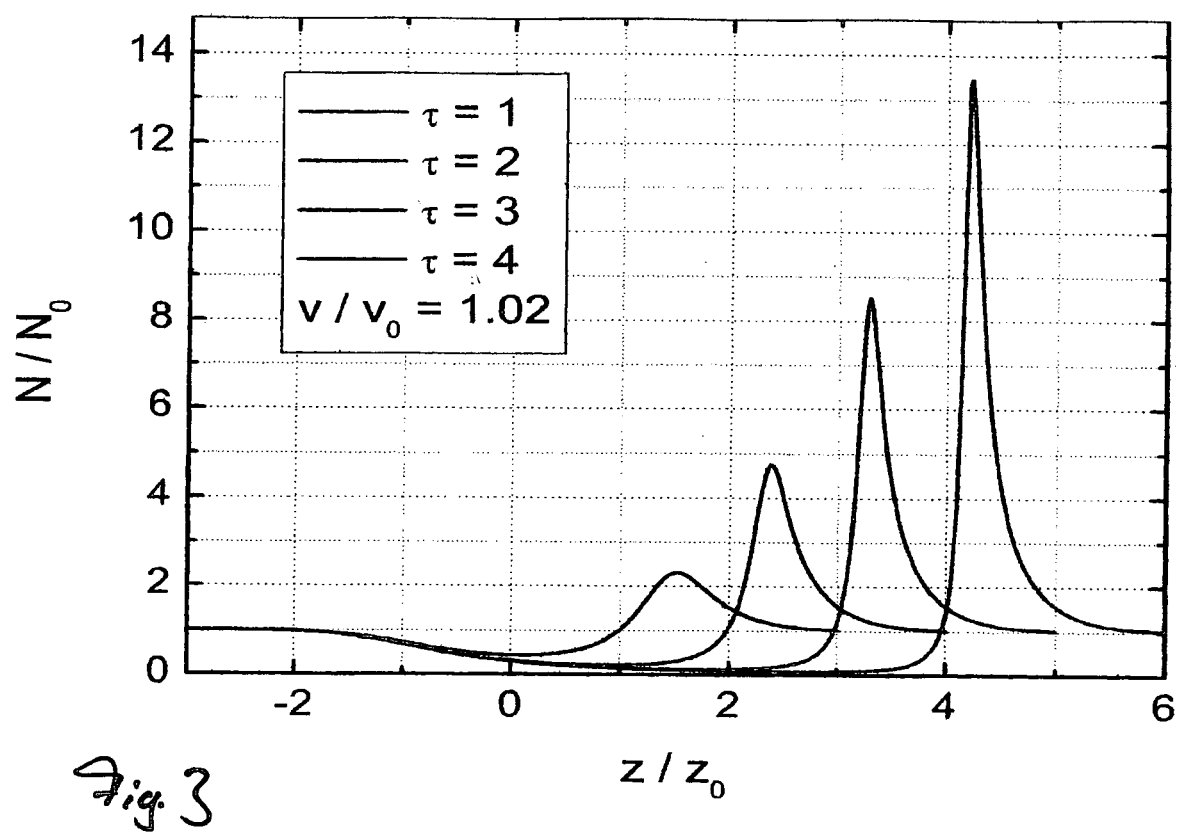
FIG. 3 shows concentration profiles for a moving beam with a Gaussian profile.

FIG. 3 shows light-induced concentration profiles for four treatment times, wherein the profiles are produced with a Gaussian light beam that was moved to the right with approximately the optimal speed $v_0 = z_0/t_0$. The beam acts in the manner of a bulldozer that transports the redistributable charges to the right-hand side. The excitable charge carriers remain behind only in very low concentration. On the other side, the concentration rises to a maximum. The peak of each concentration maximum rises with the normalized time $\tau$. Far away from the beam, the concentration is not affected.

The present invention is not limited to embodiments described herein; reference should be had to the appended claims.

What is claimed is:

1. A method for preparing a purified crystal for use in an optical component, from an impure crystal having impurities or crystal defects capable of causing a specific absorption of incident light, the method comprising:
   heating the impure crystal to a temperature at which ions in the crystal are mobile and provide conductivity;
   illuminating a part of the crystal with art electromagnetic purifying beam having a frequency in or near a visible frequency range so as to optically excite and migrate charges in the crystal, the charges being compensated by a counter-migration of the ions so as to be fixed in place thereafter so as to provide a purified crystal zone; and
   cooling the crystal to an operating temperature of the crystal.

2. The method as recited in claim 1, wherein the impurities include $Fe^{2+}$ ions.

3. The method as recited in claim 1, wherein the crystal is a lithium niobate or lithium tantalate crystal.

4. The method as recited in claim 1, wherein the operating temperature is room temperature.

5. The method as recited in claim 1, wherein the electromagnetic purifying beam has an intensity profile so that, during the illuminating, first zones of the crystal are not illuminated or are weakly illuminated, wherein the charges migrate from a lighter region to a darker region, the charges being compensated at the darker region.

6. The method as recited in claim 1, wherein the temperature to which the crystal is heated is a temperature at which electrons from locations of the crystal defects are not yet substantially thermally excited.

7. The method as recited in claim 1, wherein the temperature to which the crystal is heated is between about 150 and about 220° C.

8. The method as recited in claim 1, wherein the temperature to which the crystal is heated is a temperature at which a Maxwell time of an ionic conductivity approximately corresponds to a Maxwell time of an electronic conductivity.

9. The method as recited in claim 1, wherein the electromagnetic purifying beam is a laser beam.

10. The method as recited in claim 9, wherein the laser beam has a wavelength that approximately corresponds to at least one of a light to be used later or a light to be generated by the purified crystal by a nonlinear optical effect.

11. The method as recited in claim 1, wherein the electromagnetic purifying beam has a profile intensity with falling edges.

12. The method as recited in claim 1, wherein the profile intensity is a Gaussian profile.

13. The method as recited in claim 1, wherein the electromagnetic purifying beam is moved over the crystal in one direction at least once.

14. The method as recited in claim 1, wherein the electromagnetic purifying beam is moved along or opposite the direction of a volume photovoltaic current.

15. The method as recited in claim 1, wherein the crystal is a lithium niobate or lithium tantalate crystal containing less than 100 ppm iron.

16. The method as recited in claim 1, wherein the ions include at least one of $H^+$ and $Li^+$ ions.

17. The method as recited in claim 1, further comprising eliminating unpurified regions in the crystal.

18. The method as recited in claim 17, wherein the eliminating is undertaken by cutting.

19. The method as recited in claim 1, further comprising applying an external electric field to the crystal during the purifying by illuminating so as to reinforce the redistribution of the charges.

20. The method as recited in claim 1, further comprising introducing the ions into the crystal prior to the heating.

21. The method as recited in claim 20, wherein the introducing is performed in a moist atmosphere.

22. A treated oxide nonlinear optical crystal produced by a method for preparing a purified crystal for use in an optical component from au impure crystal having impurities or crystal defects capable of causing a specific absorption of incident light, the method comprising:
heating the impure crystal to a temperature at which ions in the crystal are mobile and provide conductivity;
illuminating a part of the crystal with an electromagnetic purifying beam having a frequency in or near a visible frequency range so as to optically excite and migrate charges in the crystal, the charges being compensated by a counter-migration of the ions so as to be fixed in place thereafter so as to provide a purified crystal zone; and
cooling the crystal to an operating temperature of the crystal.

23. The crystal recited in claim 22, wherein the crystal has periodic polarity.

24. A nonlinear optical component comprising a crystal treated by a method for preparing a purified crystal for use in an optical component from an impure crystal having impurities or crystal defects capable of causing a specific absorption of incident light, the method comprising:
heating the impure crystal to a temperature at which ions in the crystal are mobile and provide conductivity;
illuminating a part of the crystal with an electromagnetic purifying beam having a frequency in or near a visible frequency range so as to optically excite and migrate charges in the crystal, the charges being compensated by a counter-migration of the ions so as to be fixed in place thereafter so as to provide a purified crystal zone; and
cooling the crystal to an operating temperature of the crystal.

25. An electro-optical component utilizing the Pockels effect, the electro-optical component comprising a crystal treated by a method for preparing a purified crystal as recited in claim 1.

* * * * *